United States Patent [19]
Langford, II et al.

[11] Patent Number: 5,077,521
[45] Date of Patent: Dec. 31, 1991

[54] SUPPLY CONNECTION INTEGRITY MONITOR

[75] Inventors: Thomas L. Langford, II; Philip W. Bullinger; Richard D. Farris, all of Wichita, Kans.

[73] Assignee: NCR Corporation, Dayton, Ohio

[21] Appl. No.: 456,759

[22] Filed: Dec. 26, 1989

[51] Int. Cl.$^5$ .................... G01R 31/00; G01R 31/02
[52] U.S. Cl. ............................ 324/158 R; 371/25.1; 371/22.5
[58] Field of Search ............ 324/99 D, 103 P, 103 R, 324/508, 522, 537, 523, 158 R; 371/25.1, 22.5, 22.6; 340/661-663

[56] References Cited

U.S. PATENT DOCUMENTS

| | | | |
|---|---|---|---|
| 3,590,370 | 6/1971 | Fleischer | 324/51 |
| 3,796,947 | 3/1974 | Harrod et al. | 324/51 |
| 3,873,818 | 3/1975 | Barnard | 371/22.1 |
| 4,168,527 | 9/1979 | Winkler | 371/22.1 |
| 4,384,350 | 5/1983 | Lee | 340/663 |
| 4,507,713 | 3/1985 | Hsieh | 340/663 |
| 4,533,865 | 8/1985 | Schlenk | 324/51 |
| 4,550,289 | 10/1985 | Kabashima et al. | 324/158 R |
| 4,762,663 | 8/1988 | Cook et al. | 324/158 R |
| 4,795,980 | 1/1989 | Selmitt | 324/423 |
| 4,839,584 | 6/1989 | Fukuda et al. | 324/103 P |
| 4,922,188 | 5/1990 | Mario | 324/103 P |
| 4,951,171 | 8/1990 | Tran et al. | 340/663 |

OTHER PUBLICATIONS

IBM Technical Disclosure Bulletin, "In Situ Monitoring of Modules," by L. F. Waldow, vol. 21, No. 6, pp. 2416-2417, Nov. 1978.

*Primary Examiner*—Kenneth A. Wieder
*Assistant Examiner*—William J. Burns
*Attorney, Agent, or Firm*—Jack R. Penrod

[57] ABSTRACT

A monitor device connected between a pin for connection to the more positive lead of the voltage supply or the less positive voltage of the power supply and the more positive voltage supply conductors or the less positive voltage supply conductors on the integrated circuit substrate. The monitor circuit has a threshold circuit so insignificant perturbations will not trigger the monitor. The monitor circuit also has a reference voltage input such that the same circuit may be used for the more positive side of the power supply, as well as, the less positive side with straightforward modifications. When the monitor circuit detects a significant fault, i.e. one that could falsely switch part of the integrated circuit, it sets a flip-flop to record such an occurrence. The monitor flip-flop cannot be reset by the usual reset signals, in order to prevent it from being cleared by normal diagnostics and error recovery operations.

7 Claims, 3 Drawing Sheets

SUPPLY CONNECTION INTEGRITY MONITOR

BACKGROUND OF THE INVENTION

The present invention relates to an integrated circuit and, more particularly, to integrated circuits having self test capabilities for monitoring connections from their external voltage-and-current supplies to their internal more positive and more negative conductors.

As integrated circuits have become larger and more complex, a number of connection problems have arisen. One of the more difficult problems is related to the supply of voltage and current between the printed wiring board and the integrated circuit which is mounted thereon. Modern integrated circuits, such as ASIC and VLSI devices, have become so large that a single pin connection cannot carry the maximum operating current of the circuit without causing unacceptable local voltage changes. Modern integrated circuits typically resolve this problem by providing a more positive conductor grid and a more negative conductor grid within the integrated circuit. These grids, then, are connected to multiple pins which are connected to the more positive or more negative conductors of the voltage-and-current supply.

The physical structure where each pin physically and electrically joins to its respective conductor grid is known as a pad. This means that the voltage and current are connected from the voltage-and-current conductors of the printed wiring board, through a number of pins to their internal pads on the integrated circuit substrate. From the pads, the voltage and current is connected to the more positive conductor grid or the more negative conductor grid.

Since multiple pins are connected from an electrically common external point, i.e. either the more positive or the more negative conductor of the voltage and current supply, to a electrically common internal point, i.e. either the more positive or the more negative conductor grids, the pins to the more positive conductor grid are all electrically in parallel when the integrated circuit is mounted on its printed wiring board. Similarly, the pins to the more negative conductor grid are all electrically in parallel with each other. As long as each pin has the same voltage and current characteristics as its paralleled pins between its respective conductor grid and its printed wiring board conductors, the current will divide evenly among the paralleled pins according to the well known current dividing principle. Ideally then, when the integrated circuit is required by its input and output conditions to draw maximum current from the voltage-and-current supply, the maximum current will be drawn evenly by the pins and local voltage changes in the form of noise will not occur within the integrated circuit.

One major disadvantage of having multiple paralleled pins carry the supply current is that it is virtually impossible to detect a problem of a faulty connection between one of the printed wiring board supply conductors and the corresponding integrated circuit conductor grid. For example, because the multiple pins are connected in parallel from the more positive conductor of the supply on the outside of the integrated circuit package to the more positive grid of the integrated circuit on the inside, or from the less positive conductor of the supply voltage on the outside of the integrated circuit package to the less positive grid of the integrated circuit on the inside, it is impossible to test and verify that all of the paralleled pins have good connections after the package has been sealed and mounted. Thus, it is difficult or impossible to adequately test the condition of paralleled supply pins on integrated circuits, once the integrated circuit has been mounted to its printed wiring board. Therefore, a faulty connection of one of the paralleled supply pins will probably go unnoticed until the integrated circuit is called upon by its input or output conditions to drawing maximum current. However, when such a maximum current condition occurs, voltage pulses induced by a faulty connection may cause random data errors to be outputted from the integrated circuit instead of the proper data.

SUMMARY OF THE INVENTION

Briefly stated, there is provided a connection integrity monitor for an integrated circuit that has multiple pins between the more positive conductor of the printed wiring board and the corresponding more positive conductor grid of an integrated circuit, and/or multiple pins between the more negative conductor of the printed wiring board and the corresponding more negative conductor grid on the integrated circuit. The connection integrity monitor is connected at its input to one connection pad where one of the supply pins electrically connects to its respective conductor grid. The remaining connection integrity monitor components, up to the output interface, are connected to the internal integrated circuit more positive power supply conductor grid or the more negative power supply conductor grid. The connection integrity monitor is connected to one of the connection pads and responds to an input voltage that exceeds a noise threshold voltage. The connection integrity monitor compares the amount that the input voltage exceeds the threshold voltage to a reference voltage. If the amount that the input voltage exceeds the threshold voltage exceeds the reference voltage, a trigger circuit is stimulated to change its state. This trigger circuit has a fast switching, input voltage-response-characteristic such that if an input stimulates the trigger circuit to change state, the state change will be accelerated to be fast enough to reliably switch a state of a memory device. The memory device has an output interface that may be accessed by external circuits in order to determine if an unacceptable voltage pulse was induced within the integrated circuit.

In particular, there is provided in accordance with the present invention a monitoring apparatus for an integrated circuit. The apparatus includes an input detector for conducting a current in response to an input voltage that exceeds a first threshold. A holding device is connected to the input detector to develop a sample voltage that is the amount that the input voltage exceeds the threshold, and holds the sample voltage for a sufficient amount of time to be detected. A device for providing a reference voltage is connected to a comparator device. The comparator device has a first input connected to the holding device, and a second input connected to the reference voltage device for comparing an output voltage from the holding device to the reference voltage and for asserting a comparator output voltage if the output voltage of the holding device exceeds the reference voltage. A trigger circuit, which has an input connected to the output of the comparator device, triggers its output between a first output state to a second output state if the voltage at the trigger input exceeds a second threshold. A memory device, which stores a binary bit if the output of the trigger circuit changes from the first output state to the second output state, is connected to the output of the trigger device and provides an output that indicates that the integrity of the monitored connection has been insufficient.

It is, therefore, an object of the present invention to provide an apparatus for monitoring a voltage level of a supply pin where the pin connects to its pad on an integrated circuit substrate.

It is another object of the present invention to provide an apparatus which compares a voltage level of a pad to a reference voltage level to determine if the pad and its pin are properly connected.

It is a further object of the present invention is to provide a method for determining if a supply pin is making a proper connection between an external voltage-and-current supply and the internal supply conductors on the integrated circuit substrate.

These and other objects of the present invention will be apparent from the following description of the preferred embodiment and the attached drawings.

DESCRIPTION OF A PREFERRED EMBODIMENT

Figure 1:
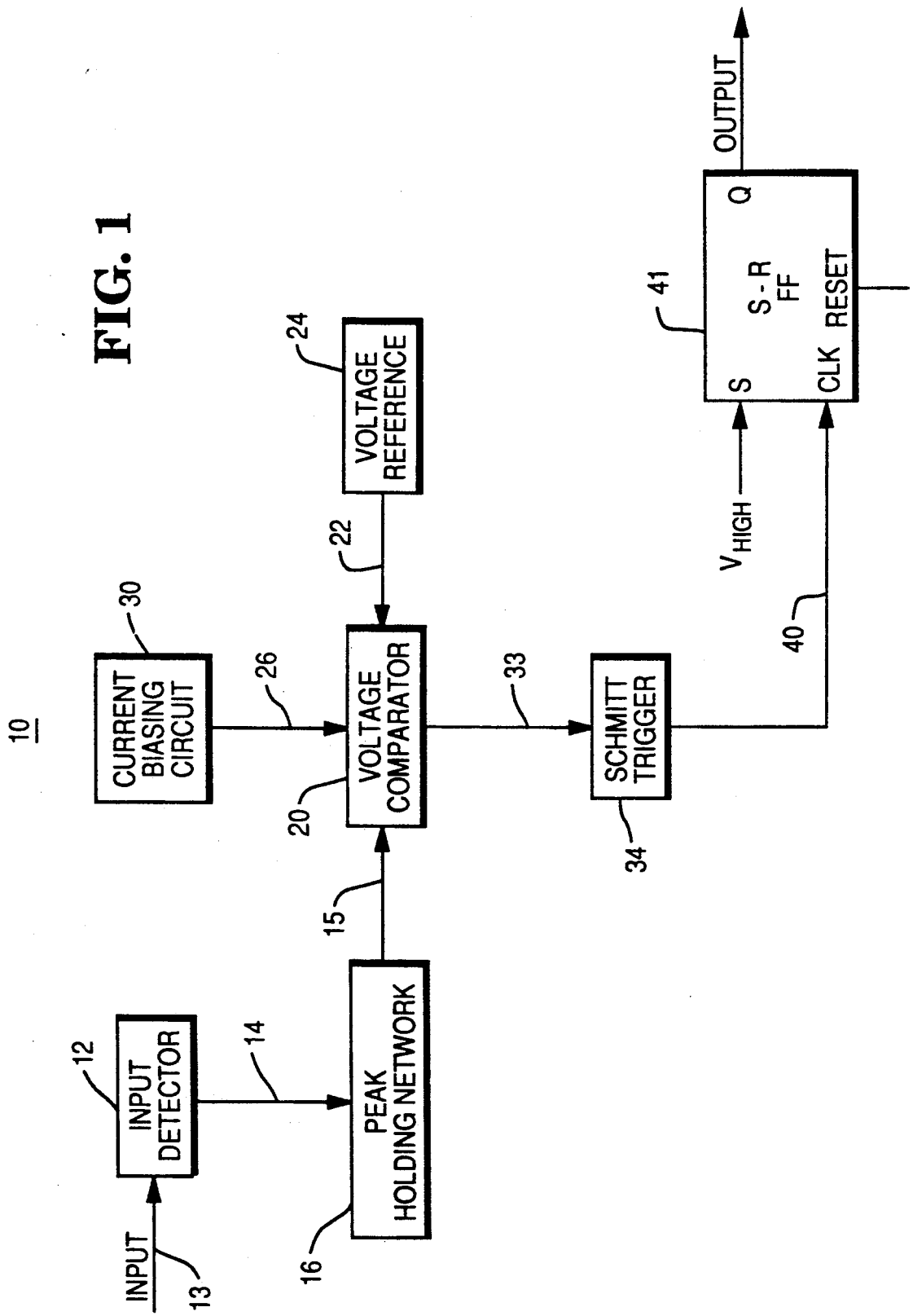
FIG. 1 is a block diagram showing a supply connection integrity monitor in accordance with the present invention.

Referring now to FIG. 1, a supply connection integrity monitor 10 is shown as including an input detector 12. The input detector 12 is connected to a pad of a voltage-and-current supply pin (not shown) via a very low current carrying input line 13. The current in line 13 is kept low so that the voltage therealong will be not be reduced by ohmic losses and will be substantially uniform along its length. The input detector 12 has an output which is connected by line 14 to a peak holding circuit 16. The peak holding circuit 16 holds a sample of the detected input voltage which is equal to an amount that the input voltage on line 13 exceeds a threshold voltage of the input detector 12. Input voltage pulses that are lower than the threshold voltage of the input detector 12 are ignored by the monitor 10 as insufficient to cause noise problems within the integrated circuit. The output of the peak holding circuit 16 is connected by line 15 to one input of a voltage comparator 20. A second input of the voltage comparator 20 is connected via line 22 to a voltage reference circuit 24. A current biasing circuit 30 is connected via line 26 to the voltage comparator 20 to reduce the sensitivity of the voltage comparator to changes in its own voltage and current conductors (not shown).

The voltage comparator 20 compares its two input voltages and outputs a voltage signal on line 33 that is in one state if the voltage from the peak holding circuit 16 is greater. This voltage signal is in a second state if the reference voltage is greater. However, when the two inputs are nearly equal, the transition time between the two states is very slow with respect to digital switching requirements. Therefore, the output of the voltage comparator 20 is connected via line 33 to a Schmitt trigger 34 which shapes the slowly transitioning output voltage from the comparator 20 to a reliable digital signal. The output of the Schmitt trigger 34 is connected via line 40 to a flip-flop 41. Flip-flop 41 is normally in one state unless it is switched by the output of the Schmitt trigger circuit 34, and once it has been switched, it remains in the switched state until a special reset is given. In this way a large input pulse on line 13 (indicating some fault in the local connection) will be held, compared, shaped and stored in order to record its occurrence.

Figure 2:
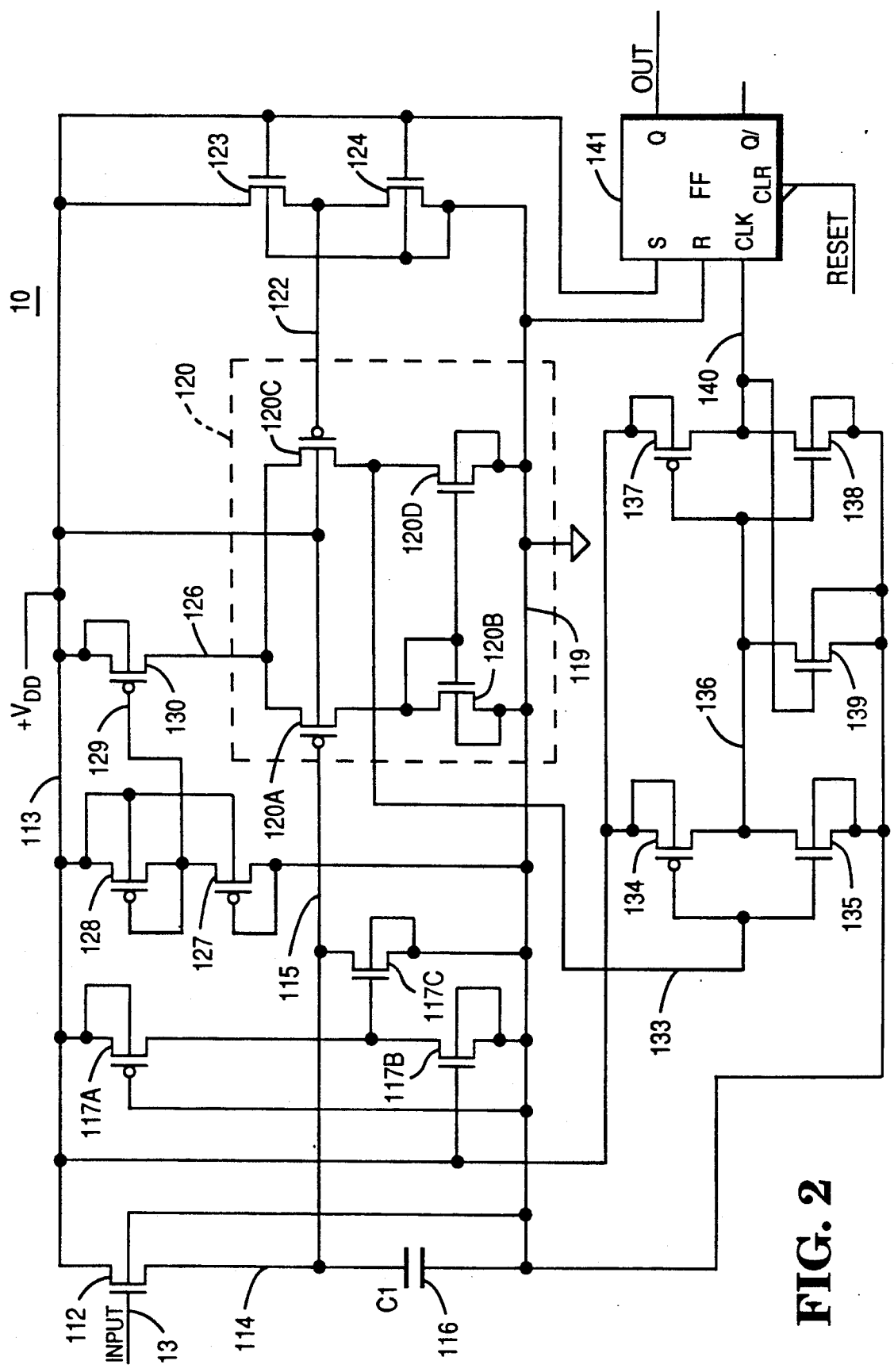
FIG. 2 is a circuit diagram of one embodiment of the monitor seen in FIG. 1.

Referring now to FIG. 2, one embodiment of the monitor 10 will be described. The input line 13, which as mentioned above is a uniform potential line, is connected to a pad of the integrated circuit at one end and to a gate of a field effect transistor (FET) 112 at its other end. To monitor the voltage level of the more negative conductor grid of the integrated circuit, the monitor 10 has the N channel FET (n-FET) 112 as its input detector 12. The drain of the n-FET 112 is connected to a more positive conductor grid 113 of the integrated circuit. The more positive conductor grid 113 is connected via multiple pins (not independently shown) to voltage +VDD of an external voltage-and-current supply (not shown). When most of the multiple pins are making proper electrical connections, the voltage +VDD seems as if it is connected to the more positive conductor grid 113 at approximately the center of the integrated circuit. Under low to medium current conditions, the voltage supplied to the more positive grid 113 will remain substantially the same even if the pin or the pad associated with the input line 13 has a faulty connection causing local noise voltages at that point.

The source of the n-FET 112 is connected via line 114 to a capacitor 116. When the voltage on line 13 exceeds the gate-to-source threshold voltage of n-FET 112, the n-FET 112 begins to conductor current from its drain to its source. Such an input voltage may be caused by a faulty connection between a connection pad and its respective pin when the device is operating as a current source (secondary or controlled current source), or as a current sink. Faulty connections typically have two components: a linear voltage caused by a poorly conducting connection and noise caused by non-linearities of a poor connection. The fault voltages are usually highest in the immediate proximity of the faulty connection but can be spread to the nearby core logic circuits (not shown). The drain-to-source current of the input detector FET 112 is conducted via line 114 to the capacitor 116, where it is quickly accumulated in a known way to develop a sample voltage. The accumulated current is bled off at a slow rate relative to the accumulation rate via line 115 by n-FET 117C. N-FET 117C is biased to electrical function as a resistor. P-FET 117A and n-FET 117B form a voltage divider and divide the potential difference between the more positive conductor grid 113 and its counterpart, more negative conductor grid 119. The gate of n-FET 117C is connected to this divided potential and is thereby biased at a constant voltage level, resulting in a constant resistance between the drain and source of n-FET 117C. This constant resistance, as mentioned above, slowly bleeds off the voltage accumulated across the capacitor 116.

The overall result is that for significant fault signals, which are detected by input detector 12, a sample will be held by the capacitor and bleed resistor combination sufficiently long for a voltage comparator 120 to make a comparison. Significant fault signals, i.e. signals of sufficient energy and duration to falsely switch the state of a nearby core logic device, will quickly develop a voltage sample. This is held by the capacitor 116 for comparasion by the voltage comparator 120 to a reference voltage. The bleed resistor network slowly bleeds the charge and voltage off so that samples that the voltage comparator 120 determines (as will be explained below) are not sufficient to cause false switching are bled off and not accumulated.

Line 115 connects the more positive plate of the capacitor 116 to voltage comparator 120 which in the preferred embodiment is a differential amplifier formed from FETs 120A, 120B, 120C and 120D. P-FETs 120A and 120C are input transistors for the differential amplifier. N-FETs 120B and 120D are identical in fabrication, and their gates are connected to a common point. In this configuration, n-FETs 120B and 120D provide equal series load resistances to their respective input p-FETs 120A and 120C. P-FET 120A has its gate connected to line 115 in order to receive fault signals from the holding capacitor 116. P-FET 120C, the other input of the differential amplifier, has its gate connected via line 122 to a mid point of a voltage divider formed by the series connection of n-FETs 123 and 124. N-FETs 123 and 124 are connected in series between the more positive conductor grid 113 and the more negative conductor grid 119. Their gates are tied to a common point, e.g. +VDD, so the voltage division between these two will depend on the channel resistance of each. One embodiment of the invention, which has been simulated by a computer simulation program, had selected channel resistances that provided a forty-to-one division of +VDD. However, those skilled in the art will recognize that other values are possible, and in some cases may be more desirable, so such variations are deemed to be within the scope of the present invention. Thus, in one embodiment of the invention, the differential amplifier compares fault voltage input connected to p-FET 120A with the constant voltage reference of approximately one-fortieth +VDD connected to the other input, p-FET 120C.

The differential amplifier p-FETs 120A and 120C have their sources tied to a common line 126. The common line 126 connects the differential amplifier to a drain of a p-FET 130. The source of the p-FET 130 is connected to the more positive conductor grid 113. The gate of p-FET 130 is connected to another voltage divider formed by p-FETs 127 and 128. The gate and the drain of p-FET 127 are connected to the more negative conductor grid 119. The source of p-FET 127 is connected to the gate and drain of p-FET 128, and also to output line 129. The source of p-FET 128 is connected to the more positive conductor grid 113 to complete the voltage divider. Connected in this manner, p-FETs 127 and 128 divide the voltage difference between the more negative conductor grid 119 and the more positive conductor grid 113, i.e. +VDD. In the aforementioned simulated embodiment, p-FETs 127 and 128 were selected such that the voltage at output line 129 would be approximately 3/5 (+VDD), but other variations of this voltage division ratio of this embodiment are deemed to be within the scope of the present invention.

Output line 129 connects the divided voltage to the gate of p-FET 130. The p-FET 130 with the constant divided voltage on its gate conducts a constant current (within its operating range) to the common branch of the differential amplifier via line 126. As is well known, a constant current device in the common branch allows the common supply voltage VDD and its return (i.e. circuit ground) to varying without causing changes in the comparison point which is determined by the reference voltage on line 122.

The differential amplifier 120, which generally performs the function of the voltage comparator 20 in FIG. 1, amplifies as well as compares the difference between the reference voltage on line 122 and the input from the holding capacitor 116. A single ended output is taken from the differential amplifier 120 between p-FET 120C and n-FET 120D. This single ended output is connected via line 133 to a Schmitt trigger stage formed by p-FETs 134 and 137, and n-FETs 135, 138, and 139. The p-FET 134 and the n-FET 135 are connected as a standard complimentary symmetry inverter between the more positive grid 113 and the more negative grid 119. The complementary symmetry inverter has a constant, high input impedance input, and thus, does not load down the differential stage when line 133 connects the gates of FETs 134 and 135 to the single ended output of the differential amplifier 120. The output of FETs 134, 135 is connected via line 136 to the commonly connected gates of a second complimentary symmetry inverter formed by p-FET 137 and n-FET 138, which are also connected between the more positive grid 113 and the more negative grid 119. The output of this second complementary inverter stage is fed back via conductor 140 to a gate of an n-FET 139. The drain of n-FET 139 is connected to line 136 and its source is connected to the more negative grid 119.

When the output of the first complementary stage on line 136 is a low voltage, the output of FETs 137, 138 is a high voltage, and n-FET 139 is driven to a low impedance state between its drain and source. This low impedance state pulls the already low level of line 136 lower yet, and accelerates the rate of the level change. The low impedance state of n-FET 139 also increases the amount of current drive required to change the state of FETs 137, 138 back to the high level, thus providing the fast switching characteristic of a Schmitt trigger. Similarly, when the output of the first complimentary stage is a high voltage, the output of FETs 137, 138 is a low voltage, and n-FET 139 is driven to a high impedance state between its drain and its source, thereby increasing the amount of current drive available to the gates of FETs 137 and 138 and accelerating the switching time of the change of state.

In this manner, the Schmitt trigger stage resists a change of logic state by the feedback action of n-FET 139 until a signal having a sufficient voltage level to trigger FETs 134 and 135 is encountered. Once a state change has reached the trigger threshold, the positive feedback action of the n-FET 139 accelerates the change to drive the complementary inverter stage of FETs 137 and 138 to the next state even faster. Thus, the Schmitt trigger stage of FETs 134, 135, 137, 138, and 139 shapes its slowly changing input voltage to a quickly transitioning binary signal.

The output of the Schmitt trigger circuit is connected via line 140 to a flip-flop 141. The preferred embodiment of the invention has an edge triggered, clocked S-R flip-flop as the flip-flop 141. This embodiment has the S input connected to the high logic level, the R input is connected to the low logic level, and the clock input connected to the Schmitt trigger output. The asynchronous clear input of flip-flop 141 is connected to a special reset circuit that is separate from the normal reset of the integrated circuit. In operation, the flip-flop 141 is asynchronously cleared at the beginning of the monitor period and any subsequent change of the logic level on line 140 will clock a high logic level into flip-flop 141 from the S input. Once a high logic level has been clocked in from the S input, the only way for the state of flip-flop 141 to change is to have its asynchronous reset terminal asserted as it is at the beginning of every monitoring period.

Figure 3:
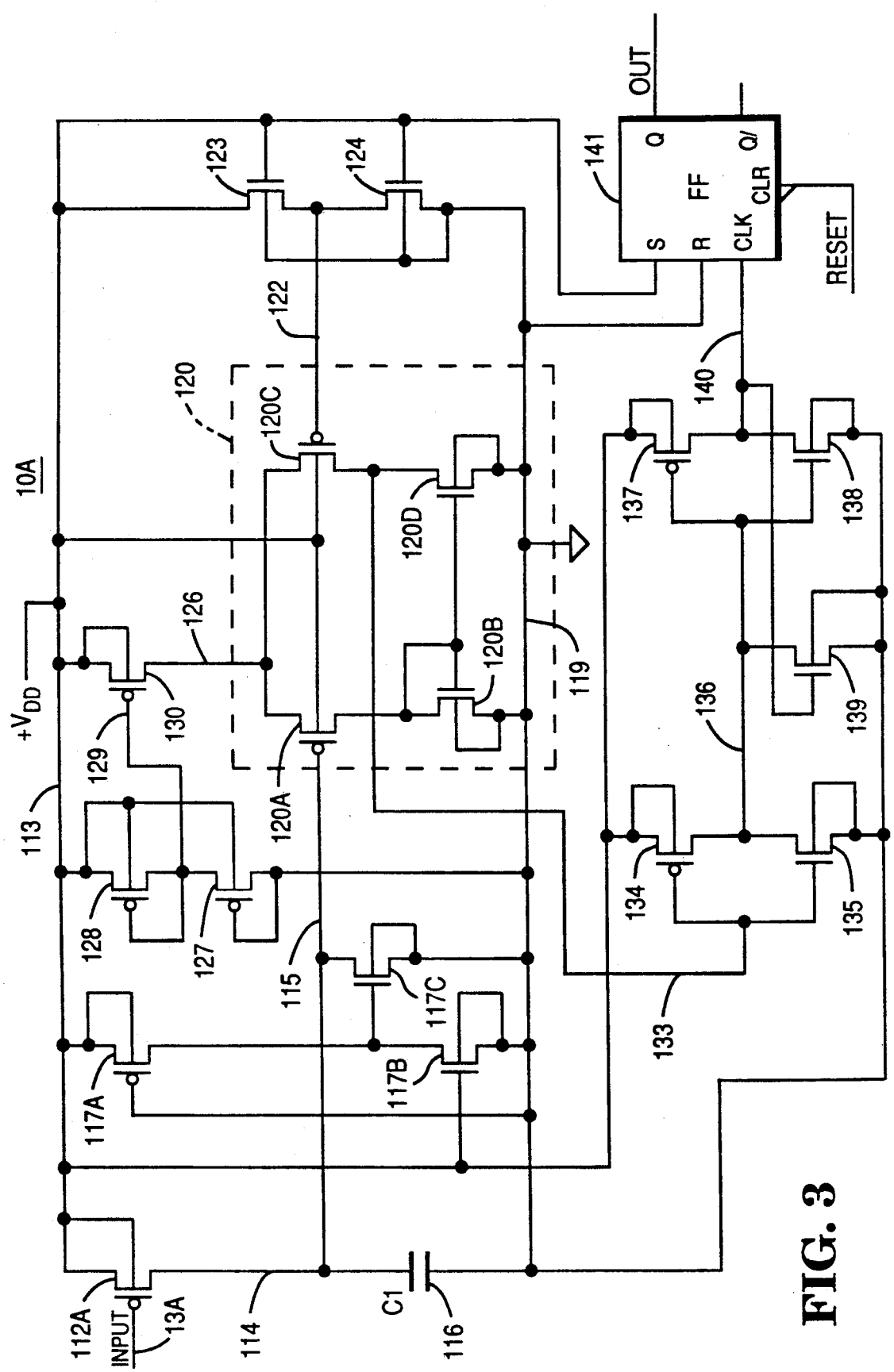
FIG. 3 is a circuit diagram of one embodiment of a monitor for monitoring a pad that is connected to the more positive conductor of the voltage and current supply.

Referring now to FIG. 3, another embodiment of the invention is shown. The primary difference between the supply connection integrity monitor 10A and the monitor 10 shown in FIG. 2, is that the monitor 10A has a p-FET 112A as its input detector instead of the n-FET 112. An input 13A is connected to a more positive pad of an integrated circuit in order to monitor a pin which is connected to the more positive conductor of the voltage and current supply. The source and substrate terminals of the p-FET 112A are connected to the more positive conductor grid 113, and the drain of p-FET 112A is connected via line 114 to the capacitor 116. The remainder of the monitor circuit 10A is virtually identical in connection and operation to the monitor circuit 10 shown in FIG. 2. It may be desirable to vary the reference voltages of the differential amplifier because of the differences in the voltage reference frame, but as mentioned before, such modifications are deemed to be within the scope of the present invention.

IN OPERATION

Referring now to FIG. 2, operation of the supply integrity monitor 10 will be described. The operation of the supply integrity monitor 10A will be very similar except that the operation of the input detector will be slightly different because of the difference in polarity.

The line 13 is a low current line that connects to a pad (not shown) of a pin that is externally connected to the more negative supply voltage, that is, integrated circuit ground. The pad is also connected by a high current conductor (not shown) to the more negative conductor grid 119.

The n-FET 112 and the capacitor 116 are located close to the monitored pad in order to detect and hold any locally occurring noise pulses, which would indicate a faulty condition, such as from pad-to-pin fault or from pin-to-printed wiring board fault. Such locally caused voltage pulses will cause current to flow through the detector 112. Capacitor 116, with FETs 117A, 117B, and 117C arranged as a very high resistance bleeder, is almost instantaneously charged by the current from the detector 112. Capacitor 116 develops and holds a sample voltage that is essentially the input peak voltage minus the gate-to-source threshold voltage of FET 112.

The sample voltage held by capacitor 116 is applied to one input of the differential amplifier 120 formed by FETs 120A-120D. The other input of the differential amplifier 120 is connected to a constant reference voltage supplied by FETs 123 and 124. The differential amplifier 120 amplifies the difference between the average voltage across capacitor 116 and the reference voltage of FETs 123 and 124 and thus operates as a voltage comparator.

When the voltage comparator changes state, this is an indication that a voltage pulse of a level sufficient to falsely trigger a logic circuit has been detected in the region of the integrated circuit where the line 13 is attached to its respective pad. The comparator output on line 133 is connected to a Schmitt trigger circuit formed by FETs 134, 135, 137, 138, and 139. The voltage at the output across FET 120D, i.e. line 133 to the more negative grid 119, of the differential amplifier 120 is normally a logic low. However, when a large noise pulse occurs on line 13, the voltage delivered by line 115 to the input of the differential amplifier 120 will exceed the reference voltage to its other input on line 122 and the differential amplifier 120 will change state. After the state of the comparator/differential amplifier has changed, there is very little current through n-FET 120A, 120B, and there is very little voltage drop across n-FET 120B. Therefore, the single ended output voltage of the differential amplifier across n-FET 120D is changed to a high binary state.

The differential amplifier 120 as a voltage comparator changes state very slowly. Unfortunately, many digital devices require a relatively rapid change between binary states in order to allow their logic gates a chance to switch quickly to the next binary state. The Schmitt trigger, with its signal shaping characteristics described previously, shortens the rise time of the slow transitioning output signal from the differential amplifier 120 into a fast rising clock pulse that will reliably clock the flip-flop 141. Thus, whenever the differential amplifier 120 changes state, the Schmitt trigger will sharpen the slowly changing output signal from differential amplifier 120 into a fast rise time clock pulse that will reliably clock flip-flop 141 from its initial low state to a high logic level to record the fault. After the state of flip-flop 141 has been changed, the changed state will remain until specially cleared by external circuits. The state of flip-flop 141 may be read at any time by external circuitry connected to its non inverted output. Thus, otherwise difficult or undetectable faulty connections of an integrated circuit may be monitored, and the results recorded for later diagnostic and/or maintenance operations.

Although the presently preferred embodiments have been described, it should be appreciated that, within the purview of the present invention, various changes may be made to the scope of the appended claims.

We claim:

1. A method for internally monitoring for a potentially fault causing voltage at a pad of an integrated circuit, comprising the steps of:
   (a) internally detecting an input voltage of the pad if said input voltage exceeds a threshold voltage, thereby indicating a fault;
   (b) internally holding a sample voltage that is equal in magnitude to an amount that said input voltage exceeds said threshold voltage;
   (c) internally comparing said sample voltage to a reference voltage and changing to a different binary output voltage state if said sample voltage exceeds said reference voltage;
   (d) internally recording the change of said binary output voltage in a memory device that is a part of the integrated circuit; and
   (e) reading an output from said memory device to an external detector to determine if the potentially fault causing voltage occurred.

2. An integrated circuit monitoring apparatus, comprising:
   input detector means for conducting a current in response to an input voltage that exceeds a first threshold;

holding means connected to the input detector means for providing a voltage that is substantially equal to said input voltage less said first threshold;

means for providing a reference voltage;

a differential amplifier having a first input connected to the holding means, and a second input connected to the reference voltage means for comparing an output voltage from the holding means to the reference voltage and asserting a comparator output voltage if the output voltage of the holding means exceeds the reference voltage;

said differential amplifier is connected to a biasing means for providing a bias voltage to the first and second inputs of the differential amplifier;

said biasing means is a common-mode transistor having its control electrode connected to a second voltage reference means;

trigger means having an input connected to the output of the comparator means, the trigger means triggers its output between a first output state to a second output state if the voltage of the trigger input exceeds a second threshold; and memory means for storing a binary bit if the output of the trigger means changes from the first output state to the second output state.

3. The monitoring apparatus according to claim 1, wherein the memory means is a flip-flop having a reset input that only resets the memory means.

4. The monitoring apparatus according to claim 3, wherein the flip-flop has an output that may be accessed by a logic circuit external to the integrated circuit.

5. An integrated circuit monitoring apparatus for monitoring an integrated circuit, comprising:

input detector means for conducting a current in response to an input voltage that exceeds a first threshold;

holding means connected to the input detector means for holding a sample of a fault signal;

a common-mode transistor having its control electrode connected to a second voltage reference means; said common-mode transistor provides a bias voltage;

means for providing a reference voltage;

a differential amplifier having a first input connected to the holding means, a second input connected to the reference voltage means, and a third input connected to the common-mode transistor; said differential amplifier for comparing an output voltage from the holding means to the reference voltage and asserting a differential amplifier output voltage if the output voltage of the holding means exceeds the reference voltage;

trigger means having an input connected to the output of the differential amplifier, the trigger means triggers its output between a low output level to a high output level if the voltage of the trigger input exceeds a second threshold; and memory means for setting a fault bit if the output of the trigger means changes logic states from a low voltage to a high voltage.

6. The monitoring apparatus according to claim 7, wherein the memory means ia a flip-flop having a reset input that only resets the memory means.

7. The monitoring apparatus according to claim 6, wherein the flip-flop has an output that may be accessed by a logic circuit external to the integrated circuit.

* * * * *